United States Patent
Watanabe et al.

(10) Patent No.: US 8,562,727 B2
(45) Date of Patent: Oct. 22, 2013

(54) ELECTROLESS PALLADIUM PLATING SOLUTION

(75) Inventors: Hideto Watanabe, Sayama (JP); Kazuhiro Kojima, Sayama (JP); Kaoru Yagi, Sayama (JP)

(73) Assignee: Kojima Chemicals Co., Ltd., Sayama-shi (JP)

( * ) Notice: Subject to any disclaimer, the term of this patent is extended or adjusted under 35 U.S.C. 154(b) by 85 days.

(21) Appl. No.: 13/319,194

(22) PCT Filed: May 7, 2010

(86) PCT No.: PCT/JP2010/058150
§ 371 (c)(1),
(2), (4) Date: Jan. 27, 2012

(87) PCT Pub. No.: WO2010/128688
PCT Pub. Date: Nov. 11, 2010

(65) Prior Publication Data
US 2012/0118196 A1    May 17, 2012

(30) Foreign Application Priority Data
May 8, 2009   (JP) .................................. 2009-113655

(51) Int. Cl.
C23C 18/44    (2006.01)

(52) U.S. Cl.
USPC ........................................ 106/1.24; 106/1.28

(58) Field of Classification Search
USPC .............................................. 106/1.24, 1.28
See application file for complete search history.

(56) References Cited

U.S. PATENT DOCUMENTS

| | | | | |
|---|---|---|---|---|
| 3,418,143 A * | 12/1968 | Sergienko | ..................... | 106/1.28 |
| 4,424,241 A * | 1/1984 | Abys | ............................. | 106/1.24 |
| 4,804,410 A * | 2/1989 | Haga et al. | .................... | 106/1.28 |
| 5,292,361 A * | 3/1994 | Otsuka et al. | ................. | 106/1.28 |
| 5,882,736 A * | 3/1999 | Stein et al. | .................... | 106/1.24 |
| 6,235,093 B1 * | 5/2001 | Okuhama et al. | ............. | 106/1.24 |
| 7,632,343 B2 * | 12/2009 | Kojima et al. | ................ | 106/1.24 |
| 7,678,183 B2 * | 3/2010 | Murasumi et al. | ........... | 106/1.24 |
| 7,704,307 B2 * | 4/2010 | Aiba et al. | .................... | 106/1.24 |
| 7,981,202 B2 * | 7/2011 | Kojima et al. | ................ | 106/1.24 |
| 8,426,742 B2 * | 4/2013 | Ejiri et al. | ...................... | 174/257 |
| 2009/0133603 A1 | 5/2009 | Murasumi et al. | | |
| 2010/0071940 A1 | 3/2010 | Ejiri et al. | | |

FOREIGN PATENT DOCUMENTS

| | | |
|---|---|---|
| JP | 06-280031 A | 10/1994 |
| JP | 11-269658 A | 10/1999 |
| JP | 2007-092092 A | 4/2007 |
| JP | 2008-291348 A | 12/2008 |

* cited by examiner

Primary Examiner — Helene Klemanski
(74) Attorney, Agent, or Firm — Venable LLP; Michael A. Sartori

(57) ABSTRACT

Disclosed is an electroless palladium plating solution which can form a plating layer having excellent soldering properties onto electronic components and the like and excellent wire bonding properties. The electroless palladium plating solution comprises a palladium compound, an amine compound, an inorganic sulfur compound and a reducing agent, wherein a combination of hypophosphorous acid or a hypophosphorous acid compound and formic acid or a formic acid compound is used as the reducing agent, and wherein the palladium compound, the amine compound, the inorganic sulfur compound, the hypophosphorous acid compound, and formic acid or the formic acid compound are contained in amounts of 0.001 to 0.1 mole/l, 0.05 to 5 mole/l, 0.01 to 0.1 mole/l, 0.05 to 1.0 mole/l and 0.001 to 0.1 mole/l, respectively. The electroless palladium plating solution is characterized by having excellent soldering properties and excellent wire bonding properties.

5 Claims, No Drawings

ELECTROLESS PALLADIUM PLATING SOLUTION

TECHNICAL FIELD

The present invention relates to an electroless palladium-phosphorus alloy plating solution used as a plating solution for soldering onto electronic parts or the like and for wire-bonding.

BACKGROUND ART

Heretofore, an electroless nickel plaing/electroless gold plating process has been employed to mount a board having an independent circuit and electronic parts.

In recent years, due to complication of circuits, it has been desired to inhibit localized corrosion of a nickel plating film. Further, there has been increasing demand for cost reduction of electronic parts or the like due to escalating gold price. In association therewith, technique has attracted attention in which various kinds of electroless palladium plating are carried out between electroless nickel plating and electroless gold plating to reduce thickness of an electroless gold plating film.

For adaptation to such a technique, an electroless palladium-phosphorus alloy plating solution and an electroless pure palladium plating solution have been proposed.

However, in a conventional electroless palladium-phosphorus alloy plating solution, since plating induction time (time that elapses before initiation of plating reaction) is long, deposition rate is low, and in association with complication of a plated circuit, palladium-unplated portions are likely to result, and further, amount of dissolved electroless nickel plating film during palladium plating tends to increase to cause a problem of localized corrosion of nickel.

On the other hand, in an electroless pure palladium plating solution, since a deposited palladium plating film is crystalline, a gold plating film and a palladium plating film are more susceptible to thermal diffusion as compared with an electroless palladium-phosphorus alloy plating film. On account of this, there is a drawback that wire-bonding properties subsequent to soldering of a high melting point solder are poor.

PRIOR ART REFERENCES

Patent Documents
Patent Document 1: Japanese Examined Patent Publication No. Hei 03 (1991)-1382
Patent Document 2: Japanese Unexamined Patent Publication No. Sho 62 (1987)-124280
Patent Document 3: Japanese Unexamined Patent Publication No. Hei 05 (1993)-39580
Patent Document 4: Japanese Unexamined Patent Publication No. 2001.3179
Patent Document 5: Japanese Unexamined Patent Publication No. 2007.92092
Patent Document 6: Japanese Unexamined Patent Publication No. Hei 08 (1996)-269727
Patent Document 7: Japanese Patent Publication No. 3035763
Patent Document 8: Japanese Patent Publication No. 4117016

SUMMARY OF THE INVENTION

Problem to be Solved by the Invention

In an electroless pure palladium plating solution, since a deposited palladium plating film is crystalline, a gold plating film and a palladium plating film are more susceptible to thermal diffusion as compared with an electroless palladium-phosphorus alloy plating film. On account of this, wire-bonding properties subsequent to soldering of a high melting point solder are poor.

It is an object of the present invention to provide an electroless palladium plating solution which has a shortened induction time of electroless palladium plating on a nickel film, which is excellent in deposition stability, which is capable of diminishing amount of dissolved nickel during palladium plating, and which is capable of providing a plated product that is excellent in soldering properties and wire-bonding properties even in a case where the plated product is brought under implementing conditions of soldering of a high melting point solder or the like.

Means to Solve the Problems

The present inventors have made intensive and extensive studies in order to overcome the above-mentioned problems. As a result, it has been found that an electroless palladium-phosphorus plating solution, which comprises complexing agents selected from palladium compounds and from amines, and a sulfur compound selected from thioglycolic acid, thiodiglycolic acid, sodium thiosulfate and sodium sulfite, wherein a reducing agent selected from hypophosphorous acid compounds and a reducing agent selected from formic acid and formates are used in combination, has an improved plating induction time and is capable of diminishing amount of dissolved nickel during palladium plating. Further, with respect to a deposited palladium film, thermal diffusion between gold and palladium subsequent to plating of a high melting point solder as a problem in an electroless pure palladium plating film is improved. Based on the facts, the present inventors have found that a plating film which is excellent in various plating properties and wire-bonding properties is formed, and have reached the present invention.

In other words, the present invention relates to an electroless palladium plating solution which comprises 0.001 to 0.1 mol/l of a palladium compound, 0.05 to 5 mol/l of an amine compound, 0.01 to 0.1 mol/l of a sulfur compound selected from thioglycolic acid, thiodiglycolic acid, sodium thiosulfate and sodium sulfite and reducing agents, wherein as the reducing agents, 0.05 to 1.0 mol/l of a reducing agent selected from hypophosphorous acid compounds and 0.001 to 0.1 mol/l of a reducing agent selected formic acid and formates are used in combination.

Effect Of The Invention

The electroless palladium plating solution of the present invention is excellent in bath stability and hence can be used for a long period of time by replenishing the palladium compound and the reducing agents.

Since as the reducing agents, a reducing agent selected from hypophosphorous acid compounds and a reducing agent selected from formic acid and formates are used in combination, induction time of electrloless plating is shortened and undeposition phenomenon of a palladium plating film is prevented.

The obtained palladium plating film contains phosphorus and thus is a palladium film having fine crystals. Further, even in a case where soldering is conducted using a high melting point solder, thermal diffusion of gold-palladium plating films is unlikely to occur, and accordingly, excellent wire-bonding properties subsequent to soldering of a high melting point solder are obtained.

MODE FOR CARRYING OUT THE INVENTION

In the following, the present invention will be described in detail.

As the palladium compound used in the electroless palladium plating solution, known palladium compounds may be mentioned. Specifically, for example, palladium chloride, palladium acetate, palladium nitrate, palladium sulfate, ammonium palladium chloride and the like may be mentioned.

Palladium concentration of the above-mentioned palladium compound is 0.001 to 0.1 mol/l, preferably 0.005 to 0.05 mol/l. If the palladium concentration is lower than 0.001 mol/l, deposition rate is lowered to cause undeposition of palladium. This is undesirable. If the palladium concentration is higher than 0.1 mol/l, stability of the plating solution is impaired. This is undesirable.

As the hypophosphorous acid compound used in the electroless palladium plating solution of the present invention, for example, sodium hypophosphite, potassium hypophosphite, ammonium hypophosphite or the like may be mentioned. The above-mentioned hypophosphorous acid compound acts as a main reducing agent and a source of phosphorus segregation on a palladium film in palladium deposition reaction, and concentration thereof is 0.01 to 1 mol/l, preferably 0.05 to 0.7 mol/l. If the concentration of the hypophosphorous acid compound is lower than 0.01 mol/l, deposition rate is lowered to cause undeposition of palladium. This is undesirable. If the concentration of the hypophosphorous acid compound is higher than 1 mol/l, stability of the plating solution is impaired. This is undesirable.

In the next place, as the amine compound used as a complexing agent in the elelctroless palladium plating solution of the present invention, there may be mentioned methylamine, dimethylamine, trimethylamine, benzylamine, metylenediamine, etylenediamine, tetrametylenediamine, dietylenetriamine, EDTA (etylenediaminetetraacetic acid), sodium etylanediaminetetraacetate, tetraetylenepentamine or the like. These amine compounds may be used alone or in combination as a mixture of two or more of them.

The amine compound is used in an amount of 0.01 to 5 mol/l, preferably 0.03 to 3 mol/l.

In the present invention, a known sulfur compound is added in order to improve stability of a plating bath and stability of deposition.

Specifically, thioglycolic acid, thiodiglycolic acid, sodium thiosulfate, sodium sulfite or the like may be mentioned.

The sulfur compound is added M an amount of 0.01 to 10 mol/l, preferably 0.03 to 5 mol/l. If the amount is less than 0.01 mol/l, the above-mentioned effects are unlikely to be obtained. If the amount is more than 10 mol/l, deposition rate is lowered to cause undeposition of palladium.

Further, into the electroless palladium plating solution of the present invention, a reducing agent selected from the hypophosphorous acid compounds and a reducing agent selected form formic acid, sodium formate, potassium formate, ammonium formate and the like are incorporated in combination.

The above-mentioned formic acid or formate serves to aid the reduction reaction of the hypophosphorous acid compound as a main reducing agent to prevent palladium undeposition.

The above-mentioned formic acid or formate is used in an amount of 0.001 to 0.1 mol/l, preferably 0.003 to 0.05 mol/l. If the amount is less than 0.001 mol/l, since ability to aid the reduction reaction of the hypophosphorous acid compound is poor, undeposition of palladium is caused. This is undesirable. If the amount is more than 0.1 mol/l, stability of the plating solution is impaired. This is undesirable.

The electroless palladium plating solution of the present invention is generally used at a temperature of 35 to 80° C. However, it is preferred to use the electroless palladium plating solution at a temperature of 40 to 70° C. If the plating temperature is lower than 35° C., deposition rate is lowered. This is practically undesirable. On the other hand, if the plating temperature is higher than 80° C., stability of the plating solution is impaired. This is undesirable.

In management of the electroless palladium plating solution of the present invention, the plating solution is used at a pH of 4.0 to 10.0, preferably 5.0 to 8.0.

If the pH of the plating solution is lower than 4.0, stability of complex of palladium with the amine compound is lowered. This is undesirable. On the other hand, if the pH of the plating solution is higher than 10, although stability of the complex of palladium with the amine compound is improved, reducing abilities of the hypophosphorous acid compound as a main reducing agent and formic acid or the formate which is used in combination therewith are increased, and hence stability of the plating solution is impaired. This is undesirable. In this connection, adjustment of the pH of the plating solution may be performed in accordance with a common method using an acid aqueous solution such as an aqueous solution of sulfuric acid or phosphoric acid or an alkaline aqueous solution such as an aqueous solution of sodium hydroxide.

In the following, the present invention will be described further in detail by means of Examples. However, the present invention is by no means restricted to the Examples, so long as the description is covered by the gist thereof.

EXAMPLE 1

| | |
|---|---|
| palladium chloride | 0.01 mol/l |
| ethylenediamine | 0.1 mol/l |
| sodium hypophosphite | 0.1 mol/l |
| sodium formate | 0.005 mol/l |
| pH of bath | 7.5 |
| temperature of bath | 50° C. |

EXAMPLE 2

| | |
|---|---|
| palladium chloride | 0.01 mol/l |
| ethylenediamine | 0.1 mol/l |
| sodium hypophosphite | 0.1 mol/l |
| sodium formate | 0.005 mol/l |
| thioglycolic acid | 0.05 mol/l |
| pH of bath | 7.5 |
| temperature of bath | 50° C. |

EXAMPLE 3

| | |
|---|---|
| palladium chloride | 0.01 mol/l |
| ethylenediamine | 0.1 mol/l |
| sodium hypophosphite | 0.1 mol/l |
| ammonium formate | 0.005 mol/l |
| thioglycolic acid | 0.05 mol/l |

-continued

| | |
|---|---|
| pH of bath | 7.5 |
| temperature of bath | 50° C. |

COMPARATIVE EXAMPLE 1

| | |
|---|---|
| palladium chloride | 0.01 mol/l |
| ethylenediamine | 0.1 mol/l |
| sodium hypophosphite | 0.1 mol/l |
| pH of bath | 8.0 |
| temperature of bath | 60° C. |

COMPARATIVE EXAMPLE 2

| | |
|---|---|
| palladium chloride | 0.01 mol/l |
| ethylenediamine | 0.1 mol/l |
| sodium hypophosphite | 0.1 mol/l |
| thioglycolic acid | 0.05 mol/l |
| pH of bath | 8.0 |
| temperature of bath | 60° C. |

COMPARATIVE EXAMPLE 3

| | |
|---|---|
| palladium chloride | 0.01 mol/l |
| ethylenediamine | 0.1 mol/l |
| sodium formate | 0.1 mol/l |
| pH of bath | 6.0 |
| temperature of bath | 70° C. |

COMPARATIVE EXAMPLE 4

| | |
|---|---|
| palladium chloride | 0.01 mol/l |
| ethylenediamine | 0.1 mol/l |
| sodium hypophosphite | 0.1 mol/l |
| dimethylamine borane | 0.005 mol/l |
| thioglycolic acid | 0.05 mol/l |
| pH of bath | 7.5 |
| temperature of bath | 50° C. |

COMPARATIVE EXAMPLE 5

| | |
|---|---|
| palladium chloride | 0.01 mol/l |
| ethylenediamine | 0.1 mol/l |
| sodium hypophosphite | 0.1 mol/l |
| trimethylamine borane | 0.005 mol/l |
| pH of bath | 7.5 |
| temperature of bath | 50° C. |

Evaluation Methods

The above-listed electroless palladium plating solutions of Examples and Comparative Examples were prepared. Each of test pieces was subjected to electroless nickel plating/electroless palladium plating/electroless gold plating. Comparison Tests were carried out in accordance with the following evaluation methods. The results are shown in Table 1.

Solution Stability Test

A 100 ml-beaker in which each of the palladium plating solutions had been poured was immersed in a constant temperature bath elevated to 90° C. to examine solution stability.

Depositability Test

On a printed circuit board provided with both conduction and independent fine electrodes, about 3 μm of an electroless nickel plating film was formed. After the resultant was subjected to water washing step for 90 seconds, it was subjected to electroless palladium plating. State of formation of the palladium plating film was examined.

Solder Wettability

Onto a copper plate of 25×25 mm, electroless nickel plating (3 μm), electroless palladium plating (0.1 μm) and electroless gold plating (0.08 μm) were applied. Solder wettability was examined using a high melting point solder.

Wire-Bonding Properties

Each of test pieces for evaluation was subjected to platings (plating conditions were the same as the above) and subjected to reflow under the same conditions as in the plating of a high melting point solder. Then, bonding was carried out using a gold wire to examine wire-bonding strength properties.

In this case, evaluation was carried out using electroless nickel plating (5 μm)/electroless gold plating (0.5 μm) as a standard.

TABLE 1

| | bath stability | deposition rate (μm/min) | Pd depositability | solder wettability | wire-bonding properties |
|---|---|---|---|---|---|
| Example 1 | decomposed 5 hrs after | 0.15 | good | good | good |
| Example 2 | remained undecomposed even 30 hrs after | 0.12 | good | good | good |
| Example 3 | remained undecomposed even 30 hrs after | 0.12 | good | good | good |
| Comparative Example 1 | decomposed 2 hrs after | 0.035 | undeposition occurred | good | good |
| Comparative Example 2 | decomposed 5 hrs after | 0.04 | undeposition occurred | good | good |

TABLE 1-continued

|  | bath stability | deposition rate (μm/min) | Pd depositability | solder wettability | wire-bonding properties |
|---|---|---|---|---|---|
| Comparative Example 3 | remained undecomposed even 30 hrs after | 0.5 | good | good | good |
| Comparative Example 4 | decomposed during heating | could not be measured | could not be measured | could not be measured | could not be measured |
| Comparative Example 5 | decomposed during heating | could not be measured | could not be measured | could not be measured | could not be measured |

From the above results, it is found that since each of the electroless palladium plating solutions of Examples of the present invention uses a hypophosphorous acid compound as a primary reducing agent and formic acid or a formate as a secondary reducing agent, the palladium plating film is compact and thus good wire-bonding properties were obtained even after the reflow of the high melting point solder.

On the other hand, in Comparative Examples 1 and 2 where a hypophosphorous acid compound was used but no formic acid or a formate was used, although wire-bonding properties were good, bath stability was poor and deposition rate was low and thus palladium undeposition phenomenon occurred at independent electrode portions.

Further, in Comparative Example 3 where sodium formate was used but no hypophosphorous acid compound was used, although bath stability was good and no insufficiency in Pd deposition was caused, wire-bonding properties were poor.

In Comparative Examples 4 and 5, bath stability was poor and both solder wettability and wire-bonding properties could not be measured.

Industrial Applicability

The electroless palladium plating solution is excellent in solder wettability and wire-bonding properties and hence has high applicability to a board soldered with a high melting point solder.

The invention claimed is:

1. An electroless palladium plating solution comprising a palladium compound, an amine compound, a sulfur compound and reducing agents, wherein
   (a) the sulfur compound is selected from the group consisting of thioglycolic acid, thiodiglycolic acid, sodium thiosulfate and sodium sulfite and contained in an amount of 0.01 to 0.1 mol/l, and
   (b) as the reducing agents, 0.05 to 1.0 mol/l of a hypophosphorous acid compound and 0.001 to 0.1 mol/l of formic acid or a formate are used in combination.

2. The electroless palladium plating solution according to claim 1, wherein the palladium compound is one or more members selected from the group consisting of palladium chloride, palladium acetate, palladium nitrate, palladium sulfate, and ammonium palladium chloride.

3. The electroless palladium plating solution according to claim 1, wherein the amine compound is one or more members selected from the group consisting of methylamine, dimethylamine, trimethylamine, benzylamine, metylenediamine, etylenediamine, tetrametylenediamine, dietylenetriamine, EDTA (etylenediaminetetraacetic acid), sodium etylanediaminetetraacetate, and tetraetylenepentamine.

4. The electroless palladium plating solution according to claim 1, wherein a pH value thereof is 4.0 to 10.0.

5. The electroless palladium plating solution according to claim 1, wherein a temperature thereof is 35 to 80° C.

* * * * *